(12) United States Patent
Peng et al.

(10) Patent No.: US 6,667,996 B2
(45) Date of Patent: Dec. 23, 2003

(54) APPARATUS AND METHOD FOR STABILIZING THE FREQUENCY OF A LASER

(75) Inventors: Jin-Long Peng, Taoyuan (TW); Mao-Sheng Huang, Hsinchu (TW); Antony Yao, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 218 days.

(21) Appl. No.: 10/004,630

(22) Filed: Dec. 4, 2001

(65) Prior Publication Data

US 2002/0158611 A1 Oct. 31, 2002

(30) Foreign Application Priority Data

Apr. 27, 2001 (TW) ........................................ 90110175 A

(51) Int. Cl.⁷ ................................................. H01S 3/13
(52) U.S. Cl. ............................................. 372/32; 372/26
(58) Field of Search ............................... 372/32, 26, 13

(56) References Cited

U.S. PATENT DOCUMENTS

| | | | | |
|---|---|---|---|---|
| 2,596,201 A | * | 5/1952 | Bocchino | .................. 43/42.04 |
| 3,640,030 A | * | 2/1972 | Clarke et al. | .................. 451/4 |
| 4,398,293 A | * | 8/1983 | Hall et al. | ...................... 372/32 |
| 4,593,189 A | * | 6/1986 | Stoub | ......................... 250/221 |
| 4,923,299 A | * | 5/1990 | Anderson et al. | ........... 356/470 |
| RE35,366 E | * | 10/1996 | Hall | .............................. 385/15 |
| 6,233,045 B1 | * | 5/2001 | Suni et al. | .................. 356/28.5 |
| 6,288,835 B1 | * | 9/2001 | Nilsson et al. | ........... 359/341.3 |
| 6,445,494 B1 | * | 9/2002 | Nilsson et al. | ........... 359/341.1 |

* cited by examiner

Primary Examiner—Leon Scott, Jr.
(74) Attorney, Agent, or Firm—Ladas & Parry

(57) ABSTRACT

The present invention discloses a novel apparatus and method for stabilizing the frequency of a laser. To avoid the effect that a single-frequency absorption spectrum is easy to be affected by variations of laser power and the complexity to modulate a laser frequency, the present invention adopts at least two laser beams at different frequencies and obtains an error signal that is a difference in absorption spectrums of the laser beams. Since the error signal is a difference between two laser beams coming from an identical laser source, the variation of laser power could be eliminated. Furthermore, since the absorption spectrum is usually above hundreds of (MHz), the range of locked frequency of the present invention is large, and the laser frequency is not easily unlocked due to outside disturbance.

8 Claims, 2 Drawing Sheets

APPARATUS AND METHOD FOR STABILIZING THE FREQUENCY OF A LASER

BACKGROUND OF THE INVENTION

1. Field of the Invention

The present invention relates to an apparatus and method for stabilizing the frequency of a laser, and particularly to an apparatus and method for stabilizing the frequency of a laser by feedbacking to correct frequency errors.

2. Description of Related Art

The application of a frequency-stabilized laser is very popular in the modern industry. The laser not only can be used in DWDM fiber communication, interferometer, spectrometer and so on, but also is an indispensable tool for many scientific researches.

A known method to stabilize a laser is to lock a laser in a cavity. However, due to extended usage and temperature variation of the cavity, a frequency drift of the laser occurs. To meet the requirement of extended usage, designers utilize atom's or molecule's spectrum as a reference, and a well-known example is a saturated absorption spectrum. However, the spectrum linewidth of the saturated absorption spectrum is so narrow, about several to hundreds of (MHz) that the range locked by this method is limited and the frequency lock always fails due to outside disturbance.

In other words, although a high stabilization can be obtained by the conventional method, the lasers can only be used in a laboratory due to complexity, a small range of locked frequency and bad noise immunity.

SUMMARY OF THE INVENTION

To solve the above problems, the present invention proposes a novel apparatus and method for stabilizing the frequency of a laser. The present invention has advantages of simple structure, a large range of locked frequency, a good noise immunity, and is suitable to a long-term use.

The present invention utilizes absorption spectrums to stabilize the frequency of a laser. To avoid the effect that a single-frequency absorption spectrum is easy to be affected by variations of laser power and the complexity to modulate the frequency of a laser, the present invention adopts at least two laser beams at different frequencies and obtains an error signal that is a difference in the absorption spectrums of laser beams. Since the error signal is a difference in two laser beams coming from an identical laser source, the variation of laser power could be eliminated. Furthermore, since the absorption spectrum is usually above hundreds of (MHz), the range of locked frequency of the present invention is large, and the laser frequency is not easily unlocked due to outside disturbance.

BRIEF DESCRIPTION OF THE DRAWINGS

The present invention will be described according to the appended drawings in which.

PREFERRED EMBODIMENT OF THE PRESENT INVENTION

Figure 1:
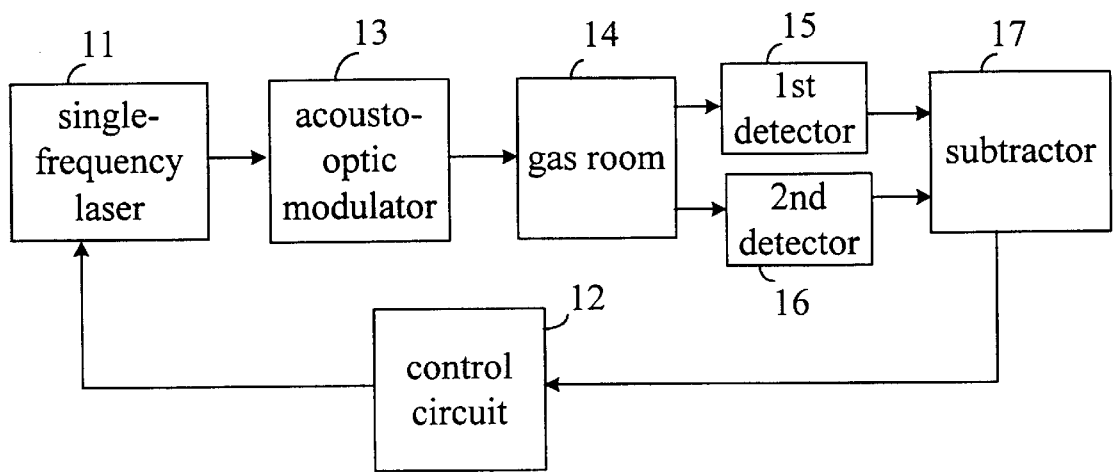
FIG. 1 is a structural diagram of the apparatus for stabilizing a laser according to the present invention.

FIG. 1 is a structural diagram of the apparatus for stabilizing a laser according to the present invention. An output beam from single-frequency laser (frequency f) 11 passes through an acousto-optic modulator 13 and obtains laser beams with a zero order (frequency f), first positive and negative orders (frequency f+Δf and f−Δf), second positive and negative orders (frequency f+2Δf and f−2Δf). Two of the above laser beams are selected and pass through a gas room 14 containing atoms or molecules (such as Cesium atom); each of the two laser beams generates a corresponding absorption spectrum which is detected by a first detector 15 and a second detector 16. Since the two absorption spectrums are interlaced, an error signal could be obtained by utilizing a subtractor 17 to subtract one absorption spectrum from the other. A control circuit 12 feedbacks the error signal to lock the frequency of the single-frequency laser 11 at a zero-crossing point of the error signal.

Besides, the frequency-locked position of the single-frequency laser 11 can be changed by changing a light intensity entering the first detector 15 and the second detector 16 or adding a DC signal to the error signal.

Figure 2:
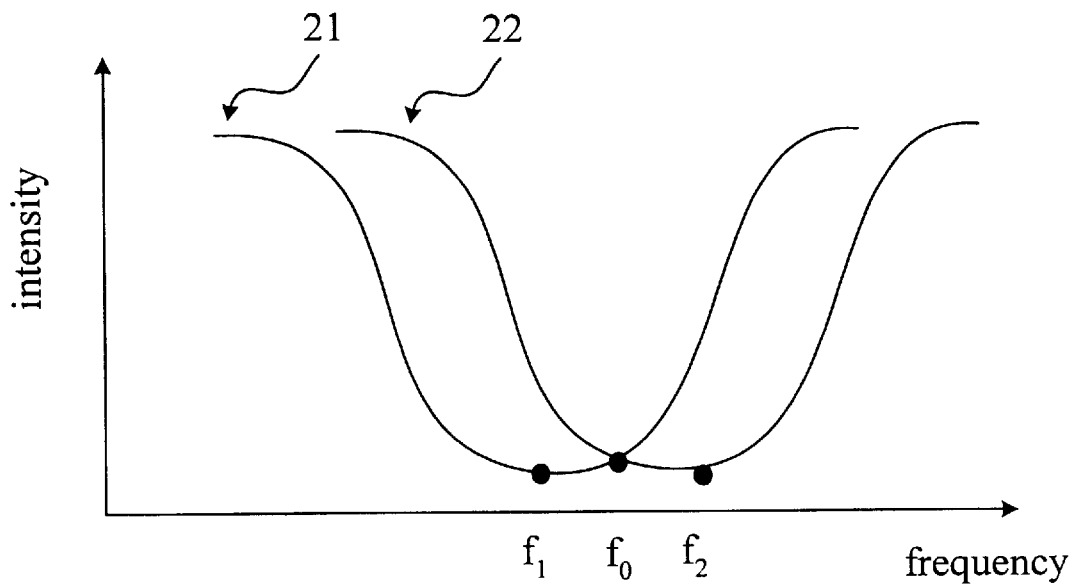
FIG. 2 is a schematic diagram of two absorption spectrums according to the present invention.

FIG. 2 is a schematic diagram of two absorption spectrums according to the present invention. A first absorption spectrum 21 and a second absorption spectrum 22 are selected from outputs of the acousto-optic modulator 13. If any of the above absorption spectrums is selected from the zero order, the single-frequency laser 11 itself replaces it. In FIG. 2, the difference between the resonance frequency $f_1$ of the first absorption spectrum 21 and the resonance frequency $f_2$ of the second absorption spectrum 22 is nΔf, wherein n is a positive integer.

Figure 3:
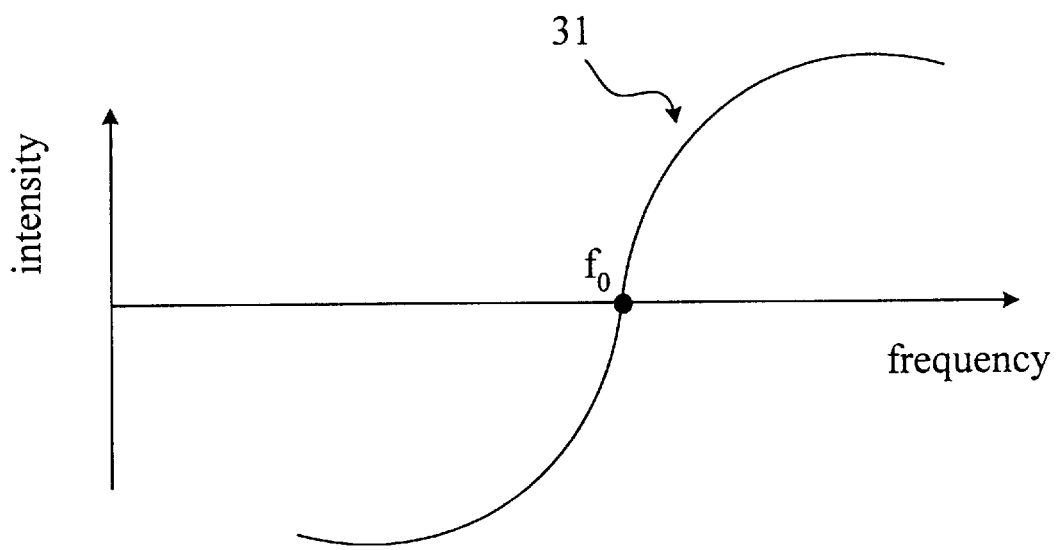
FIG. 3 shows an error signal between the two absorption spectrums of FIG. 2.

FIG. 3 shows an error signal 31 between two absorption spectrums of FIG. 2, and the error signal 31 is generated by subtracting the first absorption spectrum 21 from the second absorption spectrum 22. In FIG. 3, the locked frequency $f_0$ is a zero-crossing frequency. When the error signal is larger or less than zero, the control circuit 12 feedbacks the error signal to lock the frequency of the single-frequency laser 11 at a zero-crossing frequency $f_0$.

Figure 4:
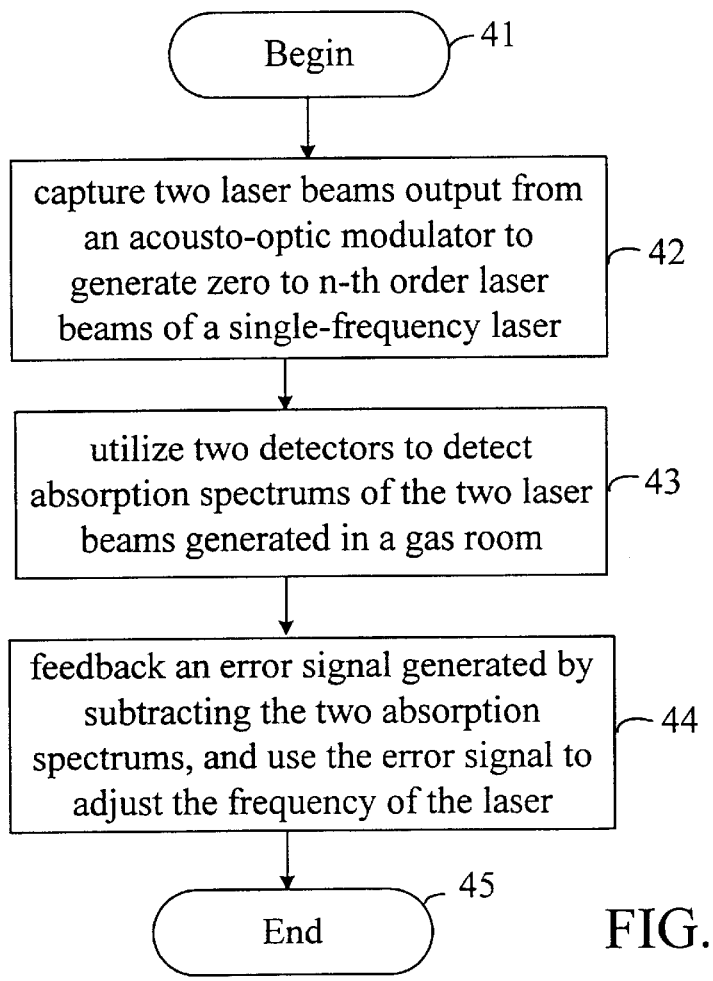
FIG. 4 shows a flow chart of the referral of the present invention.

FIG. 4 shows a flow chart of the method of the present invention. In step 41, the flow starts. In step 42, two laser beams outputted from the acousto-optic modulator 13 modulating the single-frequency laser 11 are captured. In step 43, absorption spectrums are generated by leading the two laser beams into the gas room 14, and detected by the first detector 15 and the second detector 16. In step 44, an error signal is generated by subtracting one absorption spectrum from the other, and is feedbacked to lock the frequency of the single-frequency laser 11. In step 45, the flow ends.

The above-described embodiments of the present invention are intended to be illustrative only. Numerous alternative embodiments may be devised by those skilled in the art without departing from the scope of the following claims.

What is claimed is:

1. An apparatus for stabilizing the frequency of a laser, comprising:

a single-frequency laser;

an acousto-optic modulator for generating zero-order to n-th order laser beams of the single-frequency laser, wherein n is a positive integer;

a gas room coupled to at least two output laser beams of the acousto-optic modulator for generating absorption spectrums;

at least two detectors for detecting the absorption spectrums;

a subtractor for calculating a difference between outputs of the at least two detectors; and a control circuit for adjusting the frequency of the single-frequency laser according to the difference.

2. The apparatus of claim 1, wherein the zero-order laser beam is replaced by the single-frequency laser.

3. The apparatus of claim 1, wherein the gas room contains atoms or molecules.

4. The apparatus of claim 1, wherein the control circuit adjusts the frequency of the single-frequency laser to a zero-crossing frequency.

5. The apparatus of claim 1, further comprising a DC signal added to the difference for adjusting the frequency of the single-frequency laser.

6. A method for stabilizing the frequency of a laser, comprising the following steps:

(a) generating at least two laser beams at different frequencies from a single-frequency laser;

(b) leading the at least two laser beams to pass through a gas room and generating absorption spectrums; and (c) feedbacking a difference in the absorption spectrums of the at least two laser beams to adjust the frequency of the single-frequency laser.

7. The method of claim 6, wherein in step (a), the at least two laser beams are generated by an acousto-optic modulator.

8. The method of claim 6, wherein in step (c), the frequency of the single-frequency laser is adjusted to a zero-crossing frequency.

* * * * *